(12) United States Patent
Kubena et al.

(10) Patent No.: US 11,988,727 B1
(45) Date of Patent: May 21, 2024

(54) MAGNETOSTRICTIVE MEMS MAGNETIC GRADIOMETER (71) Applicant: HRL Laboratories, LLC, Malibu, CA (US)

(72) Inventors: Randall L. Kubena, Oak Park, CA (US); Walter S. Wall, Calabasas, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 878 days.

(21) Appl. No.: 16/932,427

(22) Filed: Jul. 17, 2020

Related U.S. Application Data (60) Provisional application No. 62/881,063, filed on Jul. 31, 2019.

(51) Int. Cl.
G01R 33/022 (2006.01)
H03B 5/32 (2006.01)
H10N 30/87 (2023.01)
H10N 35/80 (2023.01)
H10N 35/85 (2023.01)

(52) U.S. Cl.
CPC ........... *G01R 33/022* (2013.01); *H03B 5/323* (2013.01); *H10N 35/80* (2023.02); *H10N 35/85* (2023.02); *H10N 30/871* (2023.02)

(58) Field of Classification Search
CPC .... G01R 33/18; G01R 33/02; G01R 33/0286; G01L 1/125
See application file for complete search history.

(56) References Cited

U.S. PATENT DOCUMENTS

| 3,821,638 A | 6/1974 | Kobayashi |
| 4,070,635 A | 1/1978 | Healey |
| 4,132,964 A | 1/1979 | Wilcox |
| 4,257,001 A | 3/1981 | Partain |
| 4,314,204 A | 2/1982 | Biel |
| 4,672,305 A | 6/1987 | Coleman |
| 5,659,270 A | 8/1997 | Millen |
| 5,675,252 A | 10/1997 | Podney |
| 5,962,786 A | 10/1999 | Le Traon |
| 6,054,856 A | 4/2000 | Garroway |

(Continued)

FOREIGN PATENT DOCUMENTS

| EP | 0496583 | 7/1992 |
| KR | 10-2008-0044977 A | 5/2008 |

(Continued)

OTHER PUBLICATIONS

PCT International Search Report and Written Opinion from PCT/US2020/051863 dated Jan. 4, 2021.

(Continued)

Primary Examiner — Jermele M Hollington
Assistant Examiner — Temilade S Rhodes-Vivour
(74) Attorney, Agent, or Firm — Ladas & Parry, LLP (57) ABSTRACT A magnetic gradiometer sensor comprising a substrate with at least a pair of resonators disposed thereon, wherein each of the at least a pair of resonators is coated with a magnetostrictive film. The resonators are preferably connected to sustaining circuits to form oscillators and the oscillators are preferably used within a phase lock loop to detect a difference in the magnetic field between the at least a pair of resonators.

27 Claims, 5 Drawing Sheets (56) References Cited

U.S. PATENT DOCUMENTS

| | | | |
|---|---|---|---|
| 6,194,900 B1 | 2/2001 | Freeman | |
| 6,279,406 B1* | 8/2001 | Li | G01R 33/18 |
| | | | 73/861.08 |
| 6,433,543 B1 | 8/2002 | Shahinpoor | |
| 6,483,480 B1 | 11/2002 | Sievenpiper | |
| 6,812,903 B1 | 11/2004 | Sievenpiper | |
| 6,888,424 B2 | 5/2005 | Takeuchi | |
| 7,046,002 B1 | 5/2006 | Edelstein | |
| 7,575,807 B1 | 8/2009 | Barvosa-Carter | |
| 7,716,985 B2 | 5/2010 | Zhang | |
| 7,750,535 B2 | 7/2010 | Kubena | |
| 7,774,155 B2 | 8/2010 | Sato | |
| 7,851,971 B2 | 12/2010 | Chang | |
| 7,892,630 B1 | 2/2011 | McKnight | |
| 7,892,876 B2 | 2/2011 | Mehregany | |
| 8,222,898 B1 | 7/2012 | Edelstein | |
| 8,390,387 B2 | 3/2013 | Lander | |
| 8,601,607 B2 | 12/2013 | Hagman | |
| 8,618,894 B2 | 12/2013 | Kim | |
| 8,760,157 B2 | 6/2014 | Miller | |
| 8,765,615 B1 | 7/2014 | Chang | |
| 8,803,751 B1 | 8/2014 | Miller | |
| 8,912,711 B1 | 12/2014 | Chang | |
| 8,994,465 B1 | 3/2015 | Kubena | |
| 9,061,886 B1 | 6/2015 | Nguyen | |
| 9,211,690 B1 | 12/2015 | McKnight | |
| 9,250,074 B1 | 2/2016 | Kubena | |
| 9,250,452 B1 | 2/2016 | Yap | |
| 9,383,208 B2 | 7/2016 | Mohanty | |
| 9,825,610 B1 | 11/2017 | Churchill | |
| 9,879,997 B1 | 1/2018 | Kubena | |
| 9,977,097 B1 | 5/2018 | Nguyen | |
| 9,991,863 B1 | 6/2018 | Kubena | |
| 10,031,191 B1 | 7/2018 | Nguyen | |
| 10,110,198 B1 | 10/2018 | Kubena | |
| 10,126,376 B1 | 11/2018 | Nguyen | |
| 10,175,307 B1 | 1/2019 | Sorenson | |
| 10,177,737 B1 | 1/2019 | Kubena | |
| 10,266,398 B1 | 4/2019 | Kubena | |
| 10,308,505 B1 | 6/2019 | Kirby | |
| 10,389,392 B1 | 8/2019 | Kubena | |
| 10,585,150 B2 | 3/2020 | Bickford | |
| 10,819,276 B1 | 10/2020 | Kubena | |
| 10,921,360 B2 | 2/2021 | Kubena | |
| 11,101,786 B1 | 8/2021 | Kubena | |
| 11,145,982 B2 | 10/2021 | Wall | |
| 11,156,897 B2 | 10/2021 | Kubena | |
| 11,239,823 B1 | 2/2022 | Kubena | |
| 11,431,293 B1 | 8/2022 | Kubena | |
| 11,563,420 B1 | 1/2023 | Kubena | |
| 11,567,147 B1 | 1/2023 | Kubena | |
| 2002/0166379 A1 | 11/2002 | Paros | |
| 2004/0194548 A1 | 10/2004 | Dayagi | |
| 2004/0263408 A1 | 12/2004 | Sievenpiper | |
| 2005/0082944 A1 | 4/2005 | Thompson | |
| 2005/0122115 A1 | 6/2005 | Maguire | |
| 2005/0174014 A1 | 8/2005 | Korden | |
| 2006/0160136 A1 | 7/2006 | Xiang | |
| 2007/0001773 A1 | 1/2007 | Oxborrow | |
| 2007/0017287 A1 | 1/2007 | Kubena | |
| 2007/0082642 A1 | 4/2007 | Hattori | |
| 2007/0180911 A1 | 8/2007 | Shoji | |
| 2007/0205849 A1 | 9/2007 | Otis | |
| 2007/0216406 A1 | 9/2007 | Witcraft | |
| 2007/0252593 A1* | 11/2007 | Takeuchi | G01R 33/18 |
| | | | 324/249 |
| 2008/0136418 A1 | 6/2008 | Renz | |
| 2008/0163689 A1 | 7/2008 | Thompson | |
| 2009/0003136 A1 | 1/2009 | Karr | |
| 2009/0109048 A1 | 4/2009 | Spivak | |
| 2009/0147254 A1 | 6/2009 | Kirby | |
| 2010/0176809 A1 | 7/2010 | Biber | |
| 2010/0295546 A1 | 11/2010 | Walther | |
| 2010/0321117 A1 | 12/2010 | Gan | |
| 2011/0062955 A1 | 3/2011 | Miller | |
| 2011/0062956 A1 | 3/2011 | Edelstein | |
| 2012/0144918 A1* | 6/2012 | Korpi | G01G 3/16 |
| | | | 73/580 |
| 2012/0294319 A1 | 11/2012 | Maleki | |
| 2013/0107467 A1* | 5/2013 | Kanno | H05K 3/4076 |
| | | | 29/829 |
| 2013/0201316 A1 | 8/2013 | Binder | |
| 2013/0217979 A1 | 8/2013 | Blackadar | |
| 2014/0111019 A1 | 4/2014 | Roy | |
| 2014/0113828 A1 | 4/2014 | Gilbert | |
| 2015/0168503 A1 | 6/2015 | Kim | |
| 2015/0295320 A1 | 10/2015 | Lee | |
| 2015/0323694 A1 | 11/2015 | Roy | |
| 2016/0003924 A1 | 1/2016 | Sun | |
| 2016/0118954 A1 | 4/2016 | Clark | |
| 2016/0209478 A1 | 7/2016 | Forstner | |
| 2016/0327597 A1 | 11/2016 | Ghionea | |
| 2016/0380357 A1 | 12/2016 | Keller | |
| 2016/0380487 A1 | 12/2016 | Widmer | |
| 2016/0380488 A1 | 12/2016 | Widmer | |
| 2017/0047893 A1 | 2/2017 | Nguyen | |
| 2017/0141622 A1 | 5/2017 | Meichle | |
| 2017/0212060 A1 | 7/2017 | Hao | |
| 2017/0244377 A1 | 8/2017 | Yamane | |
| 2017/0276848 A1 | 9/2017 | Sinclair | |
| 2017/0345449 A1 | 11/2017 | Shibata | |
| 2017/0359025 A1 | 12/2017 | Kishi | |
| 2018/0040666 A1 | 2/2018 | Shibata | |
| 2018/0057409 A1 | 3/2018 | Rosseinsky | |
| 2018/0083595 A1 | 3/2018 | Kaida | |
| 2018/0115070 A1 | 4/2018 | Wang | |
| 2018/0157148 A1 | 6/2018 | Kim | |
| 2018/0198211 A1 | 7/2018 | Wall | |
| 2018/0226720 A1 | 8/2018 | Wall | |
| 2018/0248516 A1 | 8/2018 | Nota | |
| 2018/0275230 A1 | 9/2018 | Trakimas | |
| 2018/0302032 A1 | 10/2018 | Oya | |
| 2018/0323768 A1 | 11/2018 | Ikeda | |
| 2019/0072374 A1 | 3/2019 | Mann | |
| 2019/0123714 A1 | 4/2019 | Kizu | |
| 2019/0178730 A1* | 6/2019 | Lee | H10N 35/101 |
| 2019/0245254 A1 | 8/2019 | Yamane | |
| 2019/0250198 A1 | 8/2019 | Kubena | |
| 2020/0158769 A1 | 5/2020 | Liu | |
| 2021/0242606 A1 | 8/2021 | Sepulveda | |
| 2021/0249468 A1 | 8/2021 | Heron | |

FOREIGN PATENT DOCUMENTS

| | | |
|---|---|---|
| KR | 10-2012-0132987 A | 12/2012 |
| WO | 2009-045576 | 4/2009 |
| WO | 2014-018444 A2 | 1/2014 |
| WO | 2015-072985 | 5/2015 |
| WO | 2019/217668 A1 | 11/2019 |

OTHER PUBLICATIONS

U.S. Appl. No. 16/932,431, filed Jul. 17, 2020, Kubena.
U.S. Appl. No. 16/932,447, filed Jul. 17, 2020, Kubena.
U.S. Appl. No. 16/932,455, filed Jul. 17, 2020, Kubena.
U.S. Appl. No. 15/965,652, filed Apr. 27, 2018, Kubena.
U.S. Appl. No. 16/370,602, filed Mar. 29, 2019, Kubena.
U.S. Appl. No. 16/512,091, filed Jul. 15, 2019, Sorenson.
U.S. Appl. No. 16/775,242, filed Jan. 28, 2020, Kubena.
Askari, S. et al., "Near-Navigation Grade Quad Mass Gyroscope With Q-Factor Limited by Thermo-Elastic Damping," Solid-State, Actuators, and Microsystems Workshop Technical Digest, Hilton Head, South Carolina, USA, 2016, pp. 254-257.
Bennett, S. P et al., "Magnetic Field Response of Doubly Clamped Magnetoelectric Microelectromechanical AlN—FeCo Resonators," Applied Physics Letters 111, 252903 (2017).
Bhatia, A. et al., "Linearization of Phase-Modulated Analog Optical Links using a Four-Wave Mixing Comb Source," Optics Express, DOI: 10.1364/OE 22.030899, Dec. 4, 2014.
Chang, et al., "Nonlinear UHF Quartz MEMS Oscillator with Phase Noise Reduction," 26th IEEE International Conference on

(56) References Cited

OTHER PUBLICATIONS

MicroElectroMechanical Systems, Taipei, Taiwan, Jan. 20-24, 2013, pp. 781-784.

Ganesan, A., et al., "Evidence for Simultaneous Growth and Saturation Mechanisms in Phononic Frequency Combs," IEEE, 2019 Frequency Control Symposium, Orlando, Fl. Apr. 14-18, 2019 (3 pages).

Ganesan, A., et al., "Phononic Frequency Combs For Engineering MEMS/NEMS Devices With Tunable Sensitivity," 2019 IEEE (4 pages).

Ganesan, A. et al., "Phononic Frequency Comb via Intrinsic Three-Way Mixing," Physical Review Letters, PRL 118, 033903 (2017), (5 pages).

Hui, Y. et al., High Resolution Magnetometer Based on a High Frequency Magnetoelectric MEMS-CMOS Oscillator, Journal of Micromechanical Systems, vol. 24, No. 1, Feb. 2015, pp. 134-143.

Kominis, et al., "A subfemtotesla multichannel atomic magnetometer," Nature, vol. 422, pp. 596-599 (2003).

Krishnamoorthy, U., et al., "In-plane MEMS-based Nano-g Accelerometer with Sub-wavelength Optical Resonant Sensor," Sensors and Actuators A: Physical, 145-146, Jul.-Aug. 2008, pp. 283-290.

Kubena, et al., "A Fully Integrated Quartz MEMS VHF TCXO," 2017 IEEE Frequency Control Symposium, Besancon, Fr., pp. 68-71, Jul. 2017.

Kubena, R. L., et al. "Phononic Comb Generation in High-Q Quartz Resonators", Applied Physics Letters, 116, 053501 (2020).

Nan, et.al., "Acoustically Actuated Ultra-Compact NEMS Magnetoelectric Antenna," Nature Communications, 8:296, DOI: 10.1038/s41467-017-00343-8 (2017), pp. 1-8.

Sheng, et al., "A Microfabricated Optically-Pumped Magnetic Gradiometer," Applied Physics Letters 110, 031106 (2017).

Veryaskin, A. "Gravity, Magnetic and Electromagnetic Gradiometry: Strategic Technologies in the 21st century", IOP ebooks, 2018 (57 pages).

Vrba, J., "SQUID Sensors: Fundamentals, Fabrication and Applications," edited by H. Weinstock, Kluwer Academic, Dordrecht, The Netherlands, 1996, p. 117.

Wang, S. et al., "A MEMS Resonant Accelerometer for Low-Frequency Vibration Detection," Sensors and Actuators A: Physical, 283, Nov., 2018, pp. 151-158.

Wenjie, W. et al., "A Nano-g MEMS Accelerometer for Earthquake Monitoring," 19th Intern. Conf. on Solid-State Sensors, Actuators and Microsystems (Transducers), DOI 10.1109/Transducers 2017, pp. 599-602.

Yao, et al., "Bulk Acoustic Wave-Mediated Multiferroic Antennas: Architecture and Performance Bound," IEEE Transactions on Antennas and Propagation, vol. 63, No. 8, Aug. 2015.

Zhai, J.., et al., "Detection of Pico-Tesla Magnetic Fields using Magneto-Electric Sensors at Room Temperature," Applied Physics Letters, 88, 062510 (2006).

From U.S. Appl. No. 15/801,642 (now U.S. Pat. No. 10,389,392), Notice of Allowance mailed on Apr. 5, 2019.

From U.S. Appl. No. 15/801,642 (now U.S. Pat. No. 10,389,392), Notice of Allowance mailed on Jan. 29, 2019.

From U.S. Appl. No. 15/801,642 (now U.S. Pat. No. 10,389,392), Notice of Allowance mailed on Dec. 19, 2018.

From U.S. Appl. No. 15/801,642 (now U.S. Pat. No. 10,389,392), Office Action mailed on Jun. 14, 2018.

From U.S. Appl. No. 15/965,652 (now U.S. Pat. No. 11,239,823), Notice of Allowance mailed on Jan. 21, 2022.

From U.S. Appl. No. 15/965,652 (now U.S. Pat. No. 11,239,823), Notice of Allowance mailed on Jan. 18, 2022.

From U.S. Appl. No. 15/965,652 (now U.S. Pat. No. 11,239,823), Notice of Allowance mailed on Sep. 24, 2021.

From U.S. Appl. No. 15/965,652 (now U.S. Pat. No. 11,239,823), Office Action mailed on Aug. 17, 2021.

From U.S. Appl. No. 15/965,652 (now U.S. Pat. No. 11,239,823), Office Action mailed on May 20, 2021.

From U.S. Appl. No. 16/269,847 (now U.S. Pat. No. 10,921,360), Notice of Allowance mailed on Oct. 19, 2020.

From U.S. Appl. No. 16/269,847 (now U.S. Pat. No. 10,921,360), Office Action mailed on Apr. 27, 2020.

From U.S. Appl. No. 16/269,847 (now U.S. Pat. No. 10,921,360), Office Action mailed on Oct. 17, 20219.

From U.S. Appl. No. 16/370,602 (now U.S. Pat. No. 10,819,276), Notice of Allowance mailed on Jun. 26, 2020.

From U.S. Appl. No. 16/775,242 (now U.S. Pat. No. 11,563,420), Notice of Allowance mailed on Oct. 6, 2022.

From U.S. Appl. No. 16/932,431 (now U.S. Pat. No. 11,567,147), Notice of Allowance mailed Dec. 7, 2022.

From U.S. Appl. No. 16/932,431 (now U.S. Pat. No. 11,567,147), Notice of Allowance mailed Sep. 21, 2022.

Azad, U., et al., "Direct Antenna Modulation (DAM) for Enhanced Capacity Performance of Near-Field Communication (NFC) Link," IEEE Transactions on Circuits and Systems-I: Regular Papers vol. 61, No. 3, pp. 902-910, Mar. 2014.

Filter Inductors—1812FS Series Datasheet, Oct. 12, 2015, retrieved online at: www.coilcraft.com/pdfs/1812fs.pdf.

Gamble, J.T., "Wideband Coherent Communication at VLF with the Experimental Transmitting Antenna Modulator (ETAM)," No. RADC-TR-73-287, Rome Air Development Center, Air Force Systems Command, Griffiss Air Force Base, NY, Dec. 1973.

Griffith, W.C. et al., "Miniature atomic magnetometer integrated with flux concentrators," Applied Physics Letters 94, 023502 (2009) (3 pages).

Hansen, R.C. et al., "Small Antenna Handbook," John Wiley & Sons, Inc., 2011, Chapter 3 (75 pages).

Hati, A. et al., "Reducing oscillator PM noise from AM-PM noise correlation," Electronics Letters, vol. 50, No. 17 (2014): 1195-1197.

Howe, D.A. et al., "PM-AM correlation measurements and analysis, "May 2012, IEEE International Frequency Control Symposium Proceedings (pp. 1-5). IEEE.

Hu, Z. et al., "Voltage Control of Magnetism in FeGaB/PIN-PMN-PT Multiferroic Heterostructure for High-Power and High-Temperature Applications," Applied Physics Letters, 106, 022901 (2015), 4 pages.

Kawashima, H., "New Cuts for Width-Extensional Mode Quartz Crystal Resonators," Electronics & Communications in Japan, Part 3, vol. 76, No. 12, pp. 28-36, Apr. 1993.

Kim, H.J. et al., "Piezoelectric/Magnetostructure MEMS Resonant Sensor Array for in-Plane Multi-Axis Magnetic Field Detection," IEEE MEMS 2017.

Kirby, et al. "Miniaturized VHF Quartz MEMs Resonator Design Methodology," 2017 Frequency Control Symposium, Jul. 10-13, 2017, Besancon, France.

Klemmer, T.J. et al., "Ultrahigh Frequency Permeability of Sputtered Fe—Co—B Thin Films," Journal of Applied Physics, vol. 87, No. 2, Jan. 15, 2000.

Kubena, R., et al., "MEMS-based UHF Monolithic Crystal Filters for Integrated RF Circuits," Journal of Microelectromechanical Systems, vol. 25, No. 1, pp. 118-124, Feb. 2016.

Kubena, R., et al., "Next Generation Quartz Oscillators and Filters for VHF-UHF Systems," 2006 IEEE International Microwave Symposium, San Francisco, CA, Jun. 11-16, 2006, pp. 668-671.

Kubena, R. "UHF Quartz MEMS Oscillators for Dynamics-Based System Enhancements," 2013 IEEE International Frequency Control Symposium, Prague, Czech Republic, Jul. 22-26, 2013 (8 pages).

Kubena, R., et al. "Wide-band multiferroic quartz MEMS antennae" Journal of Physics: Conference Series, 2019, pp. 1-5.

Li, M et al., "Ultra-Sensitive MEMS Magnetoelectric Sensor for Picotesla DC Magnetic Field Detection" MEMS 2017, Applied Physics Letter, 110 (2017).

Liang, C-Y et al., "Modeling of Magnetoelastic Nanostructures with a Fully Coupled Mechanical-Micromagnetic Model," Nanotechnology 25 (2014).

Pang, X., et al. "Magnetostrictive-Based Quartz MEMS RF Sensors," 2018 IEEE International Frequency Control Symposium (IFCS), 2018, pp. 1-6, doi: 10.1109/FCS.2018.8597519. (Year: 2018).

"Phase Detector/Frequency Synthesizer: ADF4002 Data Sheet" Analog Devices 2006-2015, http://www.analog.com, pp. 1-20.

Statek, CX1SM Crystal Datasheet, first accessed Mar. 14, 2016.

(56) References Cited

OTHER PUBLICATIONS

Ungan, T., et al., "RF Energy Harvesting Design Using High Q Resonators," IEEE MTT-S International Microwave Workshop on Wireless Sensing, Local Positioning, and RFID, IMWS 2009, pp. 1-4. IEEE, 2009 (4 pages).
PCT International Preliminary Report on Patentability (Chapter I) with Written Opinion from PCT/US2020/051863 mailed on Apr. 7, 2022.
From U.S. Appl. No. 16/932,455 (now published as US 2021-0091748), office action mailed on Apr. 22, 2021.

* cited by examiner

Fig. 1

Single axis gradiometer 6

MAGNETOSTRICTIVE MEMS MAGNETIC GRADIOMETER

CROSS REFERENCE TO RELATED APPLICATIONS

This application claims the benefit of U.S. Provisional Patent Application Ser. No. 62/881,063 filed 31 Jul. 2019 and entitled "Magnetostrictive MEMS Magnetic Gradiometer" this disclosure of which is hereby incorporated by reference.

This application is related to the technology disclosed in U.S. Provisional Patent Application Ser. No. 62/881,069, filed on filed 31 Jul. 2019 and entitled "Phononic Comb Enhanced Gradiometers" and to its corresponding Non-Provisional patent application Ser. No. 16/932,431, filed on the same date as this application and with the same title as the provisional application, the disclosures of which are hereby incorporated herein by reference.

This application is related to the technology disclosed in U.S. Provisional Patent Application Ser. No. 62/521,174, filed Jun. 16, 2017 and entitled "A Quartz MEMS Piezoelectric Resonator for Chipscale RF Antenna" and its related Non-Provisional patent application Ser. No. 15/965,652, filed Apr. 27, 2018 with the same title as the provisional application, the disclosures of which are hereby incorporated herein by reference.

This application is also related to the technology disclosed in U.S. Provisional Patent Application Ser. No. 62/678,897, filed 31 May 2018 and entitled "Broadband Integrated RF Magnetic Antenna", and its related non-provisional patent application Ser. No. 16/370,602 filed 29 Mar. 2019 with the same title as the provisional application, the disclosures of which are hereby incorporated herein by reference.

This application is also related to U.S. patent application Ser. No. 15/801,642 filed 2 Nov. 2017 and entitled "A High-Q Quartz-based Inductor Array for Antenna Matching", the disclosure of which is hereby incorporated herein by reference.

This application is also related to U.S. patent application Ser. No. 15/965,652, filed 27 Apr. 2018 and entitled "A Quartz MEMS Piezoelectric Resonator for Chipscale RF Antennae" and to its Provisional Application Ser. No. 62/521,174 filed Jun. 16, 2017. This application is also related to U.S. patent application Ser. No. 16/269,847, filed 7 Feb. 2019 and entitled "A Dual Magnetic and Electric Field Sensor" and to its Provisional Application Ser. No. 62/628,612 filed 9 Feb. 2018. The disclosures of each of the aforementioned US Patent Applications are hereby incorporated herein by reference.

This application is also related to U.S. Provisional Patent Application Ser. 62/826,757, filed on 29 Mar. 2019 and entitled "A femto-Tesla MEMS RF Antenna with Integrated Flux Concentrator" and to its corresponding Non-Provisional patent application Ser. No. 16/775,242, filed on 28 Jan. 2020 and with the same title as the provisional application, the disclosures of which are hereby incorporated herein by reference.

STATEMENT REGARDING FEDERALLY SPONSORED RESEARCH OR DEVELOPMENT

None

TECHNICAL FIELD

Magnetic sensing devices and technologies and more particularly magnetic gradiometers.

BACKGROUND

For commercial magnetic sensing, there are essentially three technologies that compete in the sub-pF/√Hz sensitivity range: fluxgate magnetometer, spin exchange relaxation-free (SERF) magnetometer (SERF), and superconducting quantum interference device (SQUID)-based magnetometers. All three technologies can be configured for vector magnetic detection. Fluxgate magnetometers can operate in the earth's magnetic field and have sensitivities in the 20-50 pT/√Hz range. They require no cooling or heating, but use several hundred mW of power and have limited SW of about 1 kHz. SERF atomic magnetometers have sensitivities in the 1-50 fT/√Hz range, but cannot operate in fields greater than about 100 nT. They require heating to 150° C., have power requirements of >1 W when all electronics is included, and also have SW of 1 kHz. See, for example, Kominis, I. K., Kornack, T. W., Allred, J. C. & Romalis, M. V. "A subfemtotesla multichannel atomic magnetometer," Nature 422, 596-599 (2003), the disclosure of which is hereby incorporated herein by reference. One report added extra magnetic coils for canceling the earth's magnetic field, but the gradient magnetic noise associated with the magnetic coils decreased the sensitivity to 0.5 pT/√Hz. See D. Sheng, et al., "A Microfabricated Optically-Pumped Magnetic Gradiometer," Applied Physics Letters, 110, 031106 (2017), the disclosure of which is hereby incorporated herein by reference.

SQUID-based magnetometers have sensitivities in the 1-10 fT/√Hz range, but due to dynamic range restraints cannot operate in field larger than about 10 μT. They require cooling to 4.2° K for best sensitivity and require many watts of power for operation. However, their bandwidth (SW) can exceed 100 MHz. See, for example, J. Vrba, *SQUID Sensors: Fundamentals, Fabrication and Applications*, edited by H. Weinstock Kluwer Academic, Dordrecht, The Netherlands, 1996, p. 117, the disclosure of which is hereby incorporated herein by reference.

Thus, a small cm-size MEMS-based magnetic gradiometer with a sensitivity of <1 pT/√Hz that can operate in ambient fields of 50 μT at bandwidths exceeding 1 MHz, requires no heating, cooling, or shielding, uses less than several hundred mW of power, and can be used as a vector detector would be desirable and have a wide range of applications.

Magnetostrictively-driven piezoelectric resonators offer the possibility of sensing magnetic RF fields with high sensitivity with extreme sub-wavelength (<<λ) structures and at room temperature. See T. Nan, et. al., "Acoustically Actuated Ultra-Compact NEMS Magnetoelectric Antenna," *Nature Communications*, 8:296, DOI: 10.1038/s41467-017-00343-8 (2017) and J. Zhai, et. al., "Detection of Pico-Tesla Magnetic Fields using Magneto-Electric Sensors at Room Temperature," *Applied Physics Letters*, 88, 062510 (2006), the disclosures of which is hereby incorporated herein by reference.

The sensitivity can be enhanced by the high mechanical gain (Q) of the resonator, thereby amplifying the piezoelectric voltage produced by the resonator. In addition, the magnetic layer can introduce a modulated strain in the piezoelectric resonator which can shift the oscillator frequency if the resonator is used with a feedback sustaining circuit. This frequency or phase shift can then be used as a measurement of the amplitude of the incident magnetic field. Both sensor designs can be implemented in a wafer-level (yielding ultra-thin antennas) process with high-Q quartz resonators using a Quartz MEMS process. See, for example, (i) U.S. Provisional Patent Application Ser. No. 62/521,174, filed Jun. 16, 2017 and its related non-provisional patent application Ser. No. 15/965,652, filed Apr. 27, 2018 and entitled "A Quartz MEMS Piezoelectric Resonator for Chipscale RF Antenna" mentioned above and (ii) U.S. Provisional Patent Application Ser. No. 62/678,897, filed 31 May 2018 and its related non-provisional patent application Ser. No. 16/370,602 filed 29 Mar. 2019 and entitled "Broadband Integrated RF Magnetic Antenna" also mentioned above.

BRIEF DESCRIPTION OF THE INVENTION

In many applications for precision magnetic sensing the background noise can dominate the signal. In order to reduce common-mode interference from either manmade noise or variations in the earth's magnetic field, magnetic gradiometers are used to measure the variation in the magnetic field of interest over a baseline distance. In this disclosure we present a method to easily measure the magnetic gradient between two magnetostrictively-driven MEMS resonators with wide bandwidth. Three sets of 2-pairs of resonators can be used to produce a small, cm-size, 3-axes vector gradiometer using appropriate pre-biasing conditions for the magnetostrictive films.

This disclosure addresses an apparatus and method to produce vector MEMS-based magnetic gradiometers with high bandwidth. Most vector magnetometers with sensitivities ≤pT/√Hz, e.g., SQUID and SERF magnetometers require extensive shielding to work in the earth's magnetic field and are large systems (>10 cm) with large power requirements (>1 W). Thus, it is very difficult to use them for field magnetic imaging such as magnetoencephalography or magnetocardiography. Portable or UAV imaging of magnetic objects underground, underwater, or in packaging materials is also hampered by the size and power of these systems. Thus, there is a need for small chip-scale, low power, vector magnetic gradiometers which can reject common-mode signals in noisy environments with pT or fT/√Hz sensitivities.

In one aspect the present invention provides a differential magnetic field sensor comprising a substrate with at least a pair of resonators disposed thereon, wherein each of the at least a pair of resonators is at least partially covered or coated with a magnetostrictive film.

In another aspect the present invention provides a method of sensing a difference in strengths of a magnetic field at two spaced apart locations, the method comprising disposing a first magnetic field sensitive sensor at one of said two spaced apart locations, disposing a second magnetic field sensitive sensor at the other one of said two spaced apart locations, wherein the first and second magnetic field sensitive sensors each comprise a resonator and wherein each said resonator has at least a layer of a magnetostrictive material disposed thereon.

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Fabrication processes for quartz Micro-Electro Mechanical System (MEMS) devices have been described in previous U.S. Pat. Nos. 7,750,535; 7,851,971; and 8,765,615, and in U.S. patent application Ser. No. 14/973,701 filed Dec. 17, 2015 and in U.S. Provisional Patent Application Ser. No. 62/417,111 filed on Nov. 3, 2016, the disclosures of which are hereby incorporated herein by reference. These patents and patent applications describe starting with a quartz resonator wafer and depositing top-side electrode metal and the interconnect metal for running to the bond pads. However, in the new process a magnetostrictive film or layer of material such as FeGaB or FeCoB is deposited or otherwise formed, preferably with a low stress sputtering and/or electroplating process, after or before metallic electrodes are formed. Other magnetostrictive film materials include Terfenol-D, (Ter for terbium, Fe for iron, NOL for Naval Ordnance Laboratory, and D for dysprosium), Galfenol, $Fe_xGa_{1-x}$, and Alfenol, $Fe_xAl_{1-x}Fe_{81}Si_{3.5}B_{13.5}C_2$ (Metglas), Cobalt ferrite, $CoFe_2O_4$ ($CoO \cdot Fe_2O_3$). Indeed, if the magnetostrictive material is sufficiently electrically conductive, then it may also serve the function of a metallic electrode thereby allowing the metallic electrode with which it would otherwise be in contact with to be omitted. The magnetostrictive film is formed with an anisotropic remanent magnetic field which is discussed in greater detail below.

Figure 1:
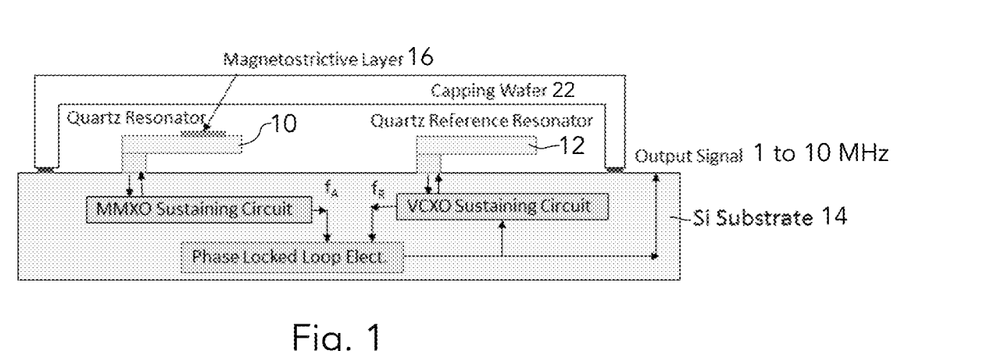
FIG. 1 depicts a wide bandwidth magnetostrictively driven magnetic field sensor or antenna using a PLL and magnetic modulated crystal oscillators (MMXO) for detecting an incident magnetic field described in U.S. Provisional Patent Application Ser. No. 62/678,897, filed 31 May 2018 and its related non-provisional patent application Ser. No. 16/370,602 filed 29 Mar. 2019 and entitled "Broadband Integrated RF Magnetic Antenna" mentioned above.

In some respects, the concepts disclosed herein derive from and are an improvement over the wide bandwidth phase detection concepts described in U.S. Provisional Patent Application Ser. No. 62/678,897, filed 31 May 2018 and its related non-provisional patent application Ser. No. 16/370,602 filed 29 Mar. 2019 and entitled "Broadband Integrated RF Magnetic Antenna" mentioned above. This concept is shown in FIG. 1 for reference. In FIG. 1 two resonators 10 and 12 are preferably mounted on a common substrate 14. One resonator (resonator 10) is coated with a magnetostrictive layer 16 on one of its electrodes (not shown) and the second resonator 12 serves as a frequency reference for a Phase Locked Loop (PLL). The second resonator of FIG. 1 has no magnetostrictive layer on it.

In this disclosure, at least one of the metallic electrodes 18 of each of the resonators 10 and 12 is at least partially covered or coated with a magnetostrictive film or layer 16 and both resonators 10, 12 are frequency shifted by an incident magnetic field as shown in FIGS. 2 and 3a-3c. The metallic electrodes 18 are omitted from FIG. 2 for drawing clarity, but can be easily seen in other figures, including FIGS. 3a-3c. Resonator 10 is preferably configured as a voltage controlled crystal oscillator (VCXO) having a sustaining circuit preferably formed by a tuning capacitor 22 and several fixed capacitors and a gain element. The capacitance of the tuning capacitor 22 is set by an AC phase error signal from a Phase ($\varphi$) Detector and Phased Locked Loop (PLL) 20 of FIG. 3c. Resonator 12 is preferably configured as a crystal oscillator (XO) having a sustaining circuit preferably formed with tunable capacitors and a gain element. Resonator sustaining circuits are well known in the art and thus are not further described here.

Figure 2:
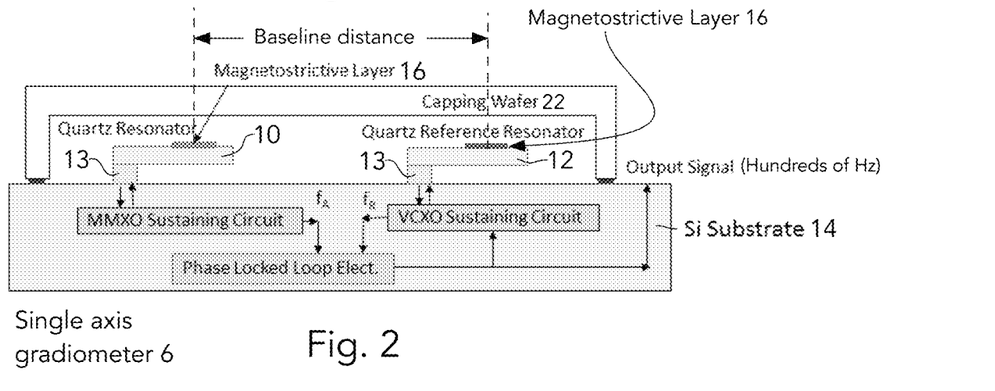
FIG. 2 is similar to FIG. 1, but in this embodiment one of the electrodes on both resonators are partially covered coated with a magnetostrictive layer allowing the device to function as a magnetic gradiometer which rejects (reduces its sensitivity to) common mode magnetic fields.
Figure 3A:
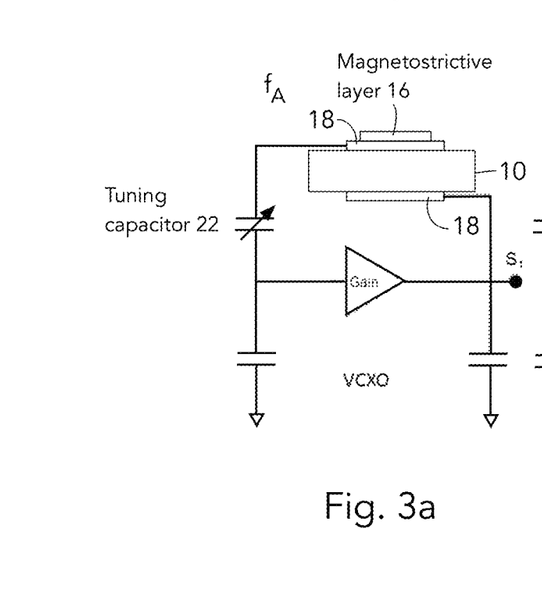
FIGS. 3a-3c provide a schematic diagram of a gradient magnetometer (magnetic gradiometer) using phase detection for wide bandwidth.
Figure 3B:
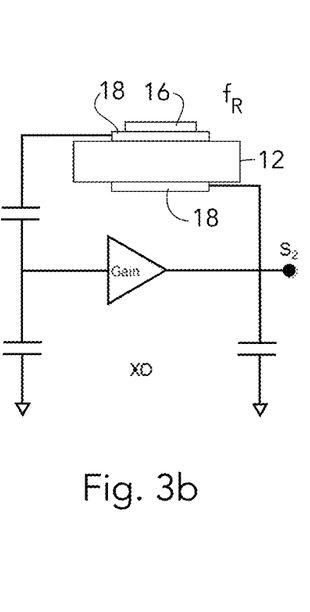
Figure 3C:
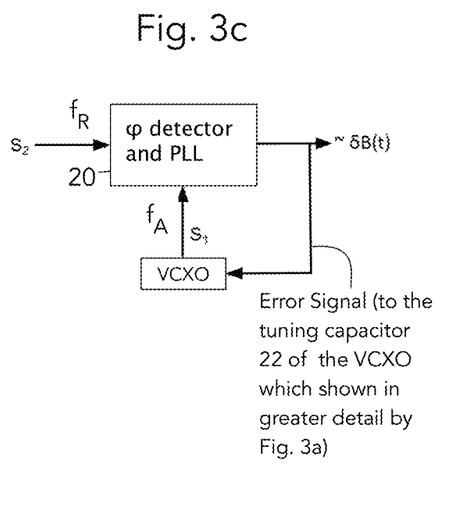
Figure 4:
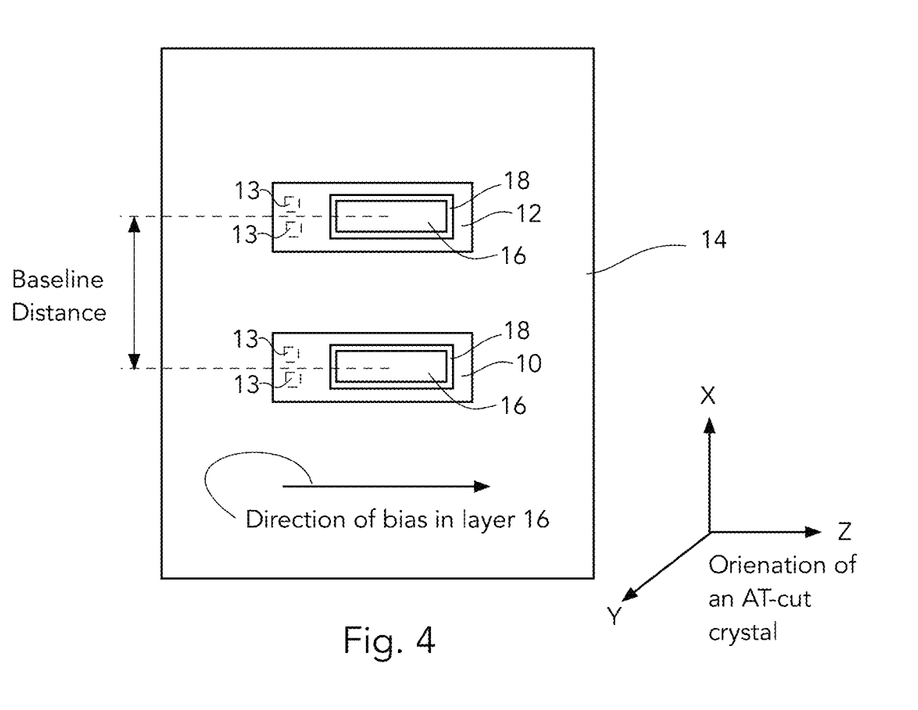
FIG. 4 depicts a top down view of the pair of resonators and circuitry of FIGS. 3a-3c are disposed on a substrate of a single IC chip.
Figure 5:
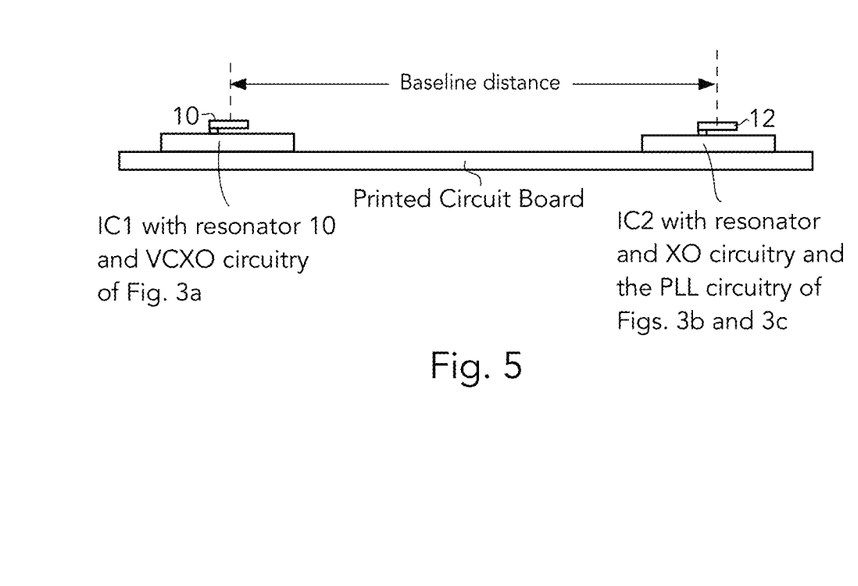
FIG. 5 depicts side elevational view of the resonator and circuitry of FIG. 3a is embodied by a first IC chip while the resonator and circuitry of the FIGS. 3b and 3c is embodied by a second IC chip, the first and second IC chips being disposed on a common printed circuit board substrate, whereby allowing the resonators of FIGS. 3a-3c to be spaced apart by a further distance than would be reasonable with the single IC chip embodiment of FIG. 4.

In this new configuration of FIGS. 2 and 3a-3c, the AC phase error detected by the PLL of FIG. 3c is determined by the spatial variation (or baseline distance) between the magnetic fields $B_1(t)$ and $B_2(t)$ respectively sensed by the resonators 10 and 12 of FIGS. 3a and 3b (or FIG. 4 or 5). Initially, during calibration, the DC frequency offset can be nulled out using the variable tuning capacitor 22 in the VCXO of FIGS. 3a and 3c. After calibration, a magnetic field gradient between the two resonators 10, 12 will induce a frequency difference which can be sensed by the Phase ($\varphi$) Detector and PLL 20. Common-mode signals to first order will be cancelled as long as the scale factor for each resonator 10, 12 (frequency shift versus applied magnetic field) is similar. The scale factor is determined by the magnetic properties of the magnetostrictive films or layers 16, the strain coupling to the quartz material of the piezoelectric resonators 10 and 12, the thickness of the magnetostrictive films or layers 16, and the magnetic bias set points along the magnetostriction versus magnetic field curves.

The resonators 10, 12 of FIGS. 3a and 3b are spaced apart by a baseline distance (see FIG. 2) and the two resonators 10, 12 sense respective magnetic fields $B_1(t)$ and $B_2(t)$ which can vary time-wise. The magnetic gradiometer desirously rejects (reduces its sensitivity to) common mode magnetic signals (which may include the earth's magnetic field, for example) and yet is responsive to differential magnetic signals (such as caused by a body of magnetic material in the earth's magnetic field). So the resonators of FIGS. 3a and 3b may be fabricated (i) on a common piezoelectric (quartz, for example) substrate (with a relatively small separation distance or a baseline distance of perhaps 1 cm) or (ii) on separate piezoelectric substrates, as shown for example in FIG. 2, where they are disposed on a common semiconductor substrate, or (iii) separate piezoelectric substrates which are spaced apart such a relatively larger distance as to make using a common semiconductor substrate impractical (but a common printed circuit board being feasible as in the embodiment of FIG. 5). The spacing between the two resonators 10, 12 is called the baseline distance and that distance may be small (perhaps a cm or so) or rather large (perhaps a meter or more) or somewhere in between depending on the size of body of magnetic material to be sensed/detected and the platform on which the sensor formed by resonators 10, 12 is mounted.

If the magnetostrictive material 16 on electrodes 18 of resonators 10, 12 of FIGS. 3a and 3b is preferably deposited with a uniform H field being applied during deposition to provide the magnetostrictive material 16 with the desired anisotropic remanent magnetic field mentioned above, the scale factors of the resonators can be expected to be similar and to within possibly 1— 5% of each other (given typical fabrication processing tolerances). This will allow a 20 to 100× common-mode rejection of external magnetic signals. Further improvements could possibly be made during fabrication by trimming the magnetic films 16 with laser or ion beam sputtering. Since the temperature and vibration gradients seen by the two resonators 10, 12 of FIGS. 3a and 3b should be minimized for small baseline distances, the rejection of environmental noise are likely improved compared to individual sensors which are located on different parts of a larger system such as shown by the embodiment of FIG. 5. In addition, by using temperature-compensated resonators 10, 12, such as quartz AT-cut shear-mode resonators, the frequency shifts due to temperature changes will be minimized compared to typical AlN or Si resonators. So the use of AT-cut quartz material for the embodiments of resonators 10, 12 of FIGS. 2, 3a, 3b, 4, 5 and 6 is preferred.

It is anticipated that using magnetostrictive films 16 with low saturation fields (e.g. <30 Oe), that the magnetic biasing can be affected by large external magnetic fields. This will shift the bias points for both resonators 10, 12 and result in a change in the gradiometer scale factor. This can be mitigated by using a magnetostrictive film or layer 16 with a larger optimal bias point than the environmental noise.

The physical sizes of the resonators 10, 12 of the embodiments of FIGS. 3a, 3b, 4, 5 and 6 are preferably identical to each other (they are preferably UHF resonators) with the metallic electrodes 18 and magnetostrictive films or layers 16 disposed, or otherwise formed, thereon are likewise preferably identical in both size and composition.

FIG. 4 is a top down view of the pair of resonators 10, 12 and circuitry of FIGS. 3a-3c disposed on and in a substrate 18 of a single IC chip. Given the technological limits on the sizes of typical IC chips, the Baseline Distance is obviously rather short.

If the resonators 10, 12 of FIGS. 3a and 3b are desirously spaced apart a greater distance than the embodiment of FIG. 4 facilitates (to thereby increase the Baseline Distance), that fact may warrant using a printed circuit board as in the embodiment of FIG. 5, then resonator 10 and its circuitry of FIG. 3a are then preferably embodied in a first IC (IC1) while the resonator 12 and its circuitry of FIG. 3b plus the Phase Detector and PLL circuitry 20 of FIG. 3c are embodied in a second IC (IC2). Each of those ICs (IC1 and IC2) are preferably encapsulated with a capping wafer (similar to wafer that of FIG. 2) and then each IC (IC1 and IC2) is then preferably disposed on a common substrate (a printed circuit board with metallic traces to interconnect the circuits shown by FIGS. 3a, 3b and 3c).

In order to pre-orient the magnetic domains in the magnetostrictive films or layers 16 to produce the desired magnetic anisotropy for magnetostriction, one can deposit the magnetic films or layers 16 in the presence of a magnetic field as mentioned above. This should produce an easy axis of orientation which is preferably along a direction of elongation of the resonators 10, 12 and is defined in FIG. 6.

Figure 6:
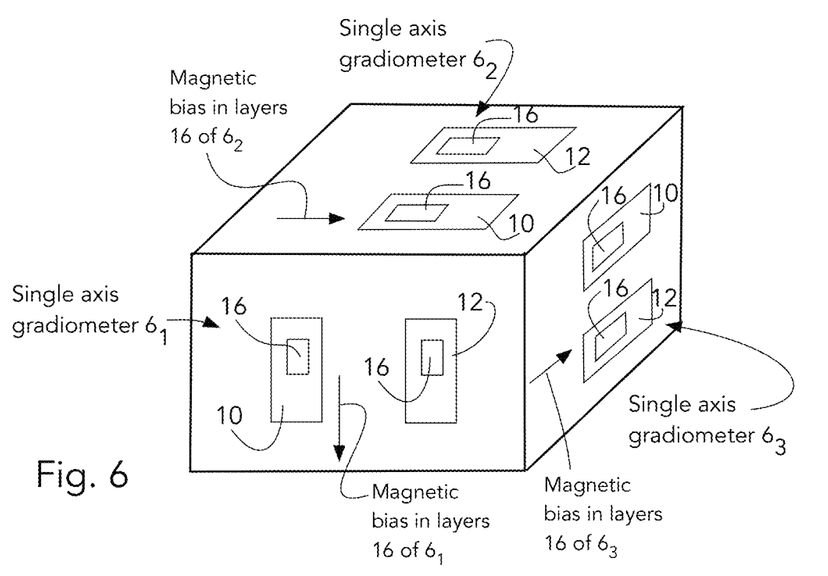
FIG. 6 depicts an embodiment of a three-axes MEMS vector magnetic gradiometer.

The pair of resonators 10, 12 with the circuitry of FIG. 2 or 3a, 3b and 3c form a single axis MEMS gradiometer 6. Three single axis MEMS gradiometers $6_1$, $6_2$ and $6_3$ form a three-axes vector magnetic gradiometer by mounting a set of three resonator pairs 10, 12 on the sides of a cube as shown in FIG. 6 so that the major plane of each pair of resonators 10, 12 is disposed at a right angle to the other two pairs of resonators 10, 12. For each pair of resonators (for example, the pair of resonator 10, 12 shown in FIG. 2 or 3a and 3b), the resonators should be magnetically biased (with a remanent magnetic moment and easy axis) in the crystal (preferably quartz) Z direction of FIG. 4 for maximum sensitivity. Based on previous reported data (see Y. Hui, et al., "High Resolution Magnetoelectric MEMS-CMOS Oscillator," *J. of Micromechanical Systems*, Vol. 24, No. 1, February 2015, pp. 134-143, the disclosure of which is hereby incorporated herein by reference), the sensitivity in the direction of the easy axis in the resonator plane will be near zero while the sensitivity in the in-plane direction normal to the easy axis (the X direction of FIG. 4) will be maximum. Since producing a perpendicular remanent magnetization is very difficult for material without a grain structure supporting a perpendicular magnetic anisotropy, the sensitivity should be near zero in the out-of-major-plane direction (the Y direction of FIG. 4) as well. Thus, a three dimensional vector gradiometer results with the configuration depicted by FIG. 6 where the directions of the remanent magnetic bias in each of the six (two per face) magnetostrictive films 16 is depicted for each of the three MEMS gradiometers $6_1$, $6_2$ and $6_3$.

The magnetostrictive material film 16 used on the resonators of FIGS. 3a and 3b may be a ferromagnetic material which exhibits magnetostrictive (or magneto-elastic) materials, such as Ni, Terfenol-D, FeGa, FeGaS, MnZn Ferrite, FeCoB, Alfenol, and/or certain MetGlas® alloys. There are other magnetostrictive materials than those identified above which may be utilized or which may be developed in the future as magnetostrictive materials. It is to be understood that the discovery of new materials which are highly magnetostrictive (also called magnetoelastic in the art) is ongoing and moreover the discovery of new materials which exhibit very little magnetostrictivity is also on going. So current (and future) magnetic materials can exhibit little or relatively large amounts of magnetostrictivity. In this disclosure the term magnetostrictive material(s) or magnetostrictive layer or magnetostrictive material film is intended to refer to magnetic materials whose magnetostrictive piezomagnetic coefficient is roughly equal to or greater than 1 ppm/Oe. Moreover, amorphous magnetostrictive materials such as FeGa, FeGaS, and FeCoS are currently preferred as the magnetostrictive material film used on the resonators of FIGS. 2, 3a and 3b, 4, 5 and 6 due to relative ease of manufacture.

The pairs of resonators 10, 12 may be UHF type quartz resonator and they should preferably be identical to each other (preferably within 10 parts in a million). The magnetostrictive material 16 is deposited on the resonators 10, 12 preferably under a magnetic bias to form the permanent magnetic moment in the quartz material as discussed above. The resonators 10, 12 tend to be elongated and their directions of elongation differ in these various embodiments. In the embodiment of FIGS. 2 & 5 the axes of elongation of the pairs of resonators are depicted as being co-linear, while in embodiments of FIGS. 4 and 6 the axes of elongation of the pairs of resonators are depicted as being parallel to each other, but other orientations of resonators 10, 12 are certainly possible. The pairs of resonators 10, 12 may be positioned in any convenient orientation relative to each other, but the depicted co-linear and parallel orientations are believed to be the most convenient orientations.

The disclosed Magnetostrictive MEMS Magnetic Gradiometers are preferably made using Micro-ElectroMechanical System (MEMS) fabrication techniques that are know per se in the art. See for example, U.S. Pat. Nos. 7,750,535; 7,851,971; and 8,765,615, and U.S. patent application Ser. No. 14/973,701 filed Dec. 17, 2015 and U.S. Provisional Patent Application Ser. No. 62/417,111 filed on Nov. 3, 2016, noted above.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of. . . . "

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A magnetic gradiometer sensor comprising a substrate with at least a pair of resonators disposed thereon, wherein each of the at least a pair of resonators is at least partially covered or coated with a magnetostrictive film; wherein an incident magnetic field on the magnetostrictive film changes the operation of the resonator, which change can be used as a measurement of an amplitude of the incident magnetic field.

2. A magnetic gradiometer sensor of claim 1 in which the at least a pair of resonators are integrated to the substrate using a metal alloy bond.

3. A magnetic gradiometer sensor of claim 2 in which the at least a pair of resonators each comprise a piezoelectric quartz material with electrically conductive electrodes disposed thereon, the magnetostrictive film being disposed, or otherwise formed, on at least one of the electrically conductive electrodes of each of the at least a pair of resonators.

4. A magnetic gradiometer sensor of claim 3 wherein the piezoelectric quartz material is a temperature-compensated cut of crystalline quartz.

5. A magnetic gradiometer sensor of claim 3 wherein the piezoelectric quartz material is an AT-cut crystalline quartz.

6. A magnetic gradiometer sensor of claim 1 in which the substrate comprises a semiconductor material with the pair of resonators being bonded thereto.

7. A magnetic gradiometer sensor of claim 1 in which the at least a pair of resonators are connected to electronics forming at least a pair of sustaining circuits, each of the at least a pair of resonators being connected to a respective one of each of the at least a pair of sustaining circuits.

8. A magnetic gradiometer sensor of claim 7 in which the electronics for the sustaining circuits for the resonators are located in or is attached to the substrate.

9. A magnetic gradiometer sensor of claim 8 in which the outputs of the sustaining circuits are used as an input to phase detection electronics.

10. A magnetic gradiometer sensor of claim 7 in which the sustaining circuit for the second one of the at least a pair of resonators is configured to operate as a crystal controlled oscillator (XO).

11. A magnetic gradiometer sensor of claim 10 in which the outputs of the sustaining circuits are used as an input to a phase locked loop (PLL) for locking the voltage controlled oscillator to a frequency of the first one of the at least a pair of resonators.

12. A magnetic gradiometer sensor of claim 11 in which phase locked loop electronics and the sustaining circuits for the resonators are located in said substrate.

13. A magnetic gradiometer sensor of claim 10 in which the error signal generated by the phase lock loop (PLL) is applied to the first one of the at least a pair of resonators and is used as an output signal for measuring a magnetic difference component of an incident RF field sensed by the pair of resonators.

14. A magnetic gradiometer sensor of claim 7 in which the sustaining circuit for the first one of the at least a pair of resonators is configured to operate as a voltage controlled crystal oscillator (VCXO).

15. A magnetic gradiometer sensor of claim 14 in which the outputs of the sustaining circuits are used as an input to a phase locked loop (PLL) for locking the voltage controlled oscillator to a frequency of the first one of the at least a pair of resonators.

16. A magnetic gradiometer sensor of claim 14 in which the error signal generated by the phase lock loop is applied to the first one of the at least a pair of resonators and is used as an output signal for measuring a magnetic component of an incident RF field.

17. A magnetic gradiometer sensor of claim 1 in which the magnetostrictive film consists of ferromagnetic material such as FeGa, FeGaB or FeCoB, Ni, Terfenol-D, Alfenol, and/or certain MerClas™ alloys or other amorphous magnetic films.

18. A magnetic gradiometer sensor of claim 1 in which the magnetostrictive film consists of a amorphous ferromagnetic material having a magnetostrictive piezoelectric coefficient roughly equal to or greater than 1 ppm/Oe.

19. A magnetic gradiometer sensor of claim 1 in which the first one of the at least a pair of resonators and the second one of the at least a pair of resonators are hermetically encapsulated in a common housing or in separate housings.

20. A magnetic gradiometer sensor of claim 19 wherein the housing(s) comprise(s) a semiconductor wafer bonded to the substrate, the semiconductor wafer of the housing comprising the same semiconductor material as the substrate.

21. A magnetic gradiometer sensor of claim 1 further including two additional substrates disposed at right angles to each other and at right angles to the first mentioned substrate, each of the two additional substrates having at least a pair of resonators disposed thereon, wherein each of the at least a pair of resonators of each of the resonators is at least partially covered or coated with a magnetostrictive film.

22. A magnetic gradiometer sensor of claim 1 wherein the at least a pair of resonators are embodied in separate IC chips.

23. A magnetic gradiometer sensor of claim 22 wherein the separate IC chips are disposed on said substrate.

24. The magnetic gradiometer sensor of claim 1, wherein said change of the operation of the resonator comprises shifting an oscillation frequency of the resonator.

25. A method of sensing a difference in strengths of a magnetic field at two spaced apart locations, the method comprising disposing a first magnetic field sensitive sensor at one of said two spaced apart locations, disposing a second magnetic field sensitive sensor at the other one of said two spaced apart locations, wherein the first and second magnetic field sensitive sensors each comprise a resonator and wherein each said resonator has at least a layer of a magnetostrictive material disposed thereon wherein an incident magnetic field on the magnetostrictive film changes the operation of the resonator, which change can be used as a measurement of an amplitude of the incident magnetic field.

26. A method according to claim 25 wherein the first and second magnetic field sensitive sensors are essentially identical to each other and are each made on a common substrate utilizing Micro-ElectroMechanical System (MEMS) fabrication techniques.

27. The method of claim 25, wherein said change of the operation of the resonator comprises shifting an oscillation frequency of the resonator.

* * * * *